United States Patent [19]

Hanna

[11] Patent Number: 4,996,498
[45] Date of Patent: Feb. 26, 1991

[54] COMMON MODE COMPENSATION FOR DIFFERENTIAL INTEGRATING FILTER

[75] Inventor: John E. Hanna, Mesa, Ariz.

[73] Assignee: Motorola, Inc., Schaumburg, Ill.

[21] Appl. No.: 460,481

[22] Filed: Jan. 3, 1990

[51] Int. Cl.$^5$ .............................................. H03F 3/45
[52] U.S. Cl. .................................... 330/258; 330/310; 307/491
[58] Field of Search ...................... 330/9, 69, 252, 258, 330/306, 310; 307/490, 491, 494

[56] References Cited

U.S. PATENT DOCUMENTS 4,697,152  9/1987  Westwick ..................... 330/258 X
4,918,399  4/1990  Devecchi et al. ............. 330/258 X

*Primary Examiner*—Steven Mottola
*Attorney, Agent, or Firm*—Michael D. Bingham

[57] ABSTRACT

A filter cell having common mode compensation for use in a differential integrating filter includes a transconductance amplifier that comprises a pair of differentially connected transistors the bases of which are coupled to respective inputs of the filter cell and whose emitters are interconnected to a current sinking transistor while the collectors are coupled via respective output circuitry to first and second outputs of the filter cell. Circuitry is provided to set the common voltage levels at the first and second outputs of the comprising a pair of resistors commonly connected at a circuit node that is a virtual ground for differential signals and the first and second filter cell outputs respectively. The circuit node is also coupled to the base of the current sinking transistor to thereby for a common mode closed loop in conjunction with a current supply that is also coupled to the circuit node. Common mode compensation to inhibit loop instability is provided by a pair of capacitors coupled in series between the collectors of differentially connected transistors and having the junction therebetween connected to the base of the current sinking transistor.

7 Claims, 2 Drawing Sheets

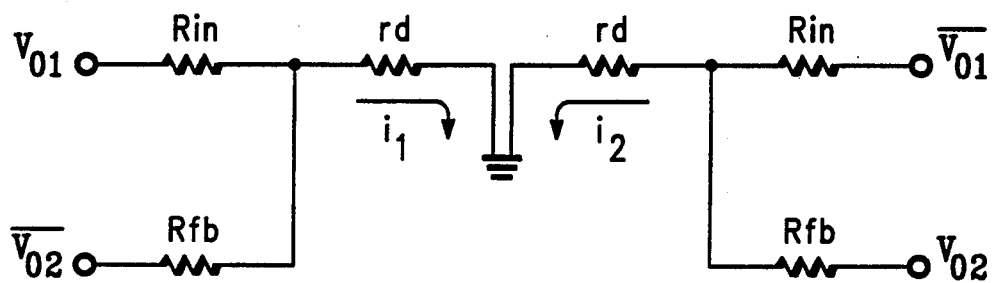
*FIG. 3*
*FIG. 4*
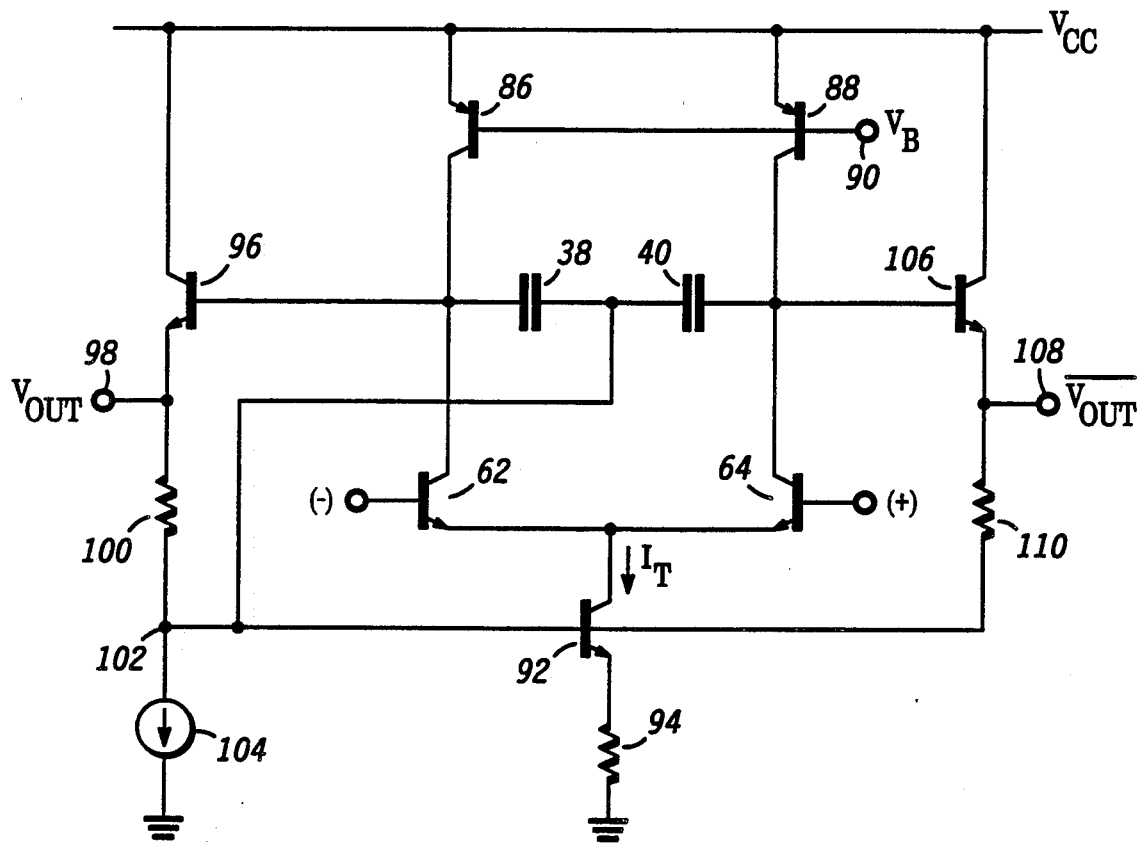

COMMON MODE COMPENSATION FOR DIFFERENTIAL INTEGRATING FILTER

BACKGROUND OF THE INVENTION

The present invention relates to filters and, more particularly, to filters suited to be realized in integrated circuit form which utilize differential transconductance amplifiers.

Prior art filters utilizing transconductance amplifiers of the type disclosed in U.S. Pat. No. 3,692,650 in which the gain is variable are known. These filters utilize transconductance amplifiers in a single ended configuration and generally include an integrating capacitor coupled across the output to thereby form a filter cell. By cascading filter cells a multiple filter can be derived which, for example, may be used to provide video signal filtering. For instance, a two-pole filter comprising a pair of single ended transconductance amplifiers connected in series is shown in Vol. CE-32, #3, August '86, *IEEE Transaction On Consumer Electronics*. Feedback is provided from the output of the two-pole filter to the individual filter cells.

It is desirable to be able to control the damping factor of these type of filters in order to control the pass band and out of band cut-off of the filter among other characteristics thereof. This desirability is limited by the prior filters using single-ended configured transconductance amplifiers. In these types of filters, in order to change the damping factor, either the ratios of the gm of the amplifiers or the capacitor ratios of the integrating capacitors must be varied since the damping factor is a function thereof. In most prior art such filters the gm of each of the transconductance amplifiers are made equal to one another which means that to control the damping factor the ratios of the integrating capacitors must be varied. The problem faced in the prior art is that to obtain a damping factor significantly different from a value of one-half requires a large change in the ratio of the capacitors which may not be achievable if these types of filters are to be fabricated in integrated circuit form. Alternately, ratioing gm values tends to cause poor control over the ratio as gms are changed. In addition, typical prior art filters of the foregoing type in general have the integrating capacitors coupled between the output of the transconductance amplifiers and either ground or the power supply rail. This creates an additional problem in that the loop stability is poor.

Hence, a need arises to be able to realize in integrated circuit form at least a two-pole filter which utilizes cascaded transconductance amplifier stages in which the damping factor can be controlled without requiring large changes in capacitor ratios and in which the integrating capacitor or portion thereof can be used to compensate a common mode loop that sets the common mode output of the filter.

SUMMARY OF THE INVENTION

Accordingly, it is an object of the present invention to provide an improved integratable filter.

It is another object of the present invention to provide a differential integrating filter comprised of differential transconductance amplifier stages.

Still another object of the present invention is to provide a filter cell for a differential integrating filter having common mode compensation.

In accordance with the above and other objects there is provided a filter cell having common mode compensation for use in a differential integrating filter including a transconductance amplifier that comprises a pair of differentially connected transistors the bases of which are coupled to respective inputs of the filter cell and whose emitters are interconnected to a current sinking transistor while the collectors are coupled via respective output circuitry to first and second outputs of the filter cell. Circuitry is provided to set the common voltage levels at the first and second outputs of the comprising a pair of resistors commonly connected at a circuit node that is a virtual ground for differential signals and the first and second filter cell outputs respectively. The circuit node is also coupled to the base of the current sinkining transistor to thereby for a common mode closed loop in conjunction with a current supply that is also coupled to the circuit node. Common mode compensation to inhibit loop instability is provided by a pair of capacitors coupled in series between the collectors of differently connected transistors and having the junction therebetween connected to the base of the current sinking transistor.

BRIEF DESCRIPTION OF THE DRAWING

FIG. 3 is a simplified schematic diagram of the equivalent filter cell input circuit of FIG. 2; and FIG. 4 is a simplified schematic diagram of the filter cell of FIG. 2 including common mode compensation in accordance with the preferred embodiment.

DETAILED DESCRIPTION OF THE PREFERRED EMBODIMENT

Figure 1:
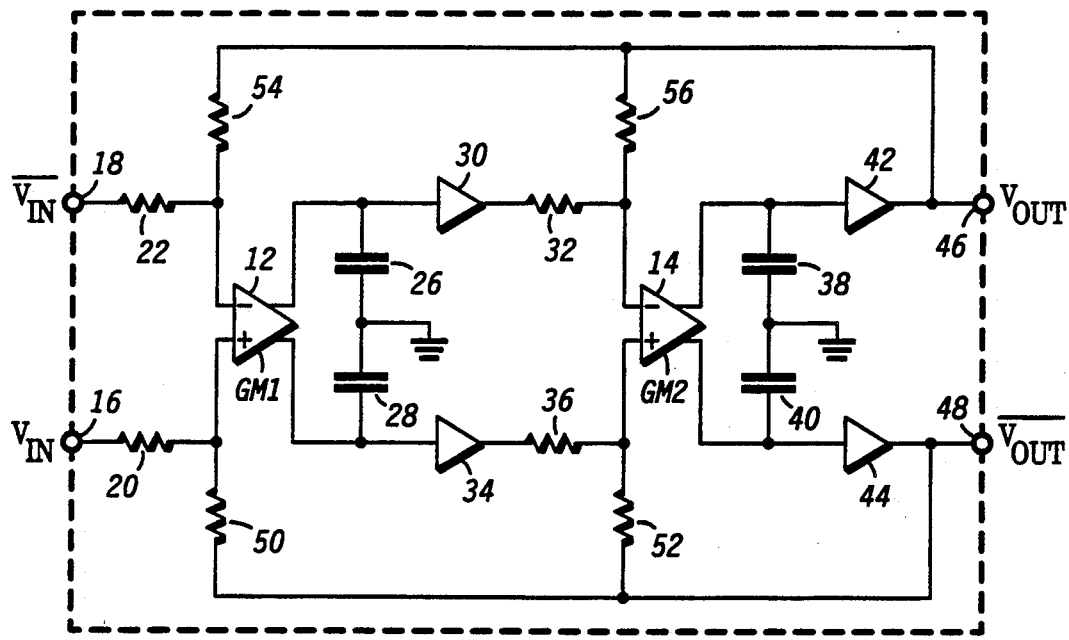
FIG. 1 is a partial schematic and block diagram illustrating a differential integrating filter of the present invention.

Turning to FIG. 1 there is shown a two-pole filter 10 of the present invention that uses cascaded differential transconductance amplifier stages 12 and 14 each of which form an individual filter cell as will be described in more detail hereinbelow. Filter 10 has a filter response, which as understood, has a natural resonance frequency ($\omega_n$) and a damping factor ($\zeta$) the latter of which controls the filter response. By controlling the magnitude of $\zeta$, the filter can be made to have a predetermined pass band and cut off frequency as is well understood. Filter 10 receives differential input voltage signals Vin and $\overline{Vin0}$ at inputs 16 and 18 which are coupled via input resistors 20 and 22 to the non-inverting and inverting inputs respectively of transconductance amplifier 12. The integrating capacitor of the first filter cell comprised of amplifier 12 is formed by capacitors 26 and 28 which are series coupled across the outputs of amplifier 12 with the interconnection therebetween being coupled to ground reference. The complementary outputs of amplifier 12 are coupled to the respective differential inputs of transconductance amplifier 14 through buffer amplifiers 30 and 34 and input resistors 32 and 36. Similarly, a pair of series coupled capacitors 38 and 40 are coupled across the complementary output of amplifier 14 with the interconnection therebetween returned to ground. The outputs of amplifier 14 are also coupled to respective filter outputs 46 and 48 via buffer amplifiers 42 and 44. The outputs of filter 10 are fed back to the individual filter cells via feedback resistors 50, 52 and 54, 56. The transconductance amplifiers 12 and 14 have an associated transconductance $gm_1$ and $gm_2$.

In response to the applied input signals Vin and $\overline{Vin0}$ output signals Vout and $\overline{Vout0}$ are produced at outputs 46 and 48 according to the filter response which is a function of the resonant frequency and the damping factor of the filter. As will be discussed later, by using differential transconductance amplifiers with multiple inputs (via the input resistors and feedback resistors) to form filter 10, the two pole filter provides a frequency transfer function that can be varied. The frequency transfer function can be controlled by varying the natural resonant frequency and the damping factor.

Figure 2:
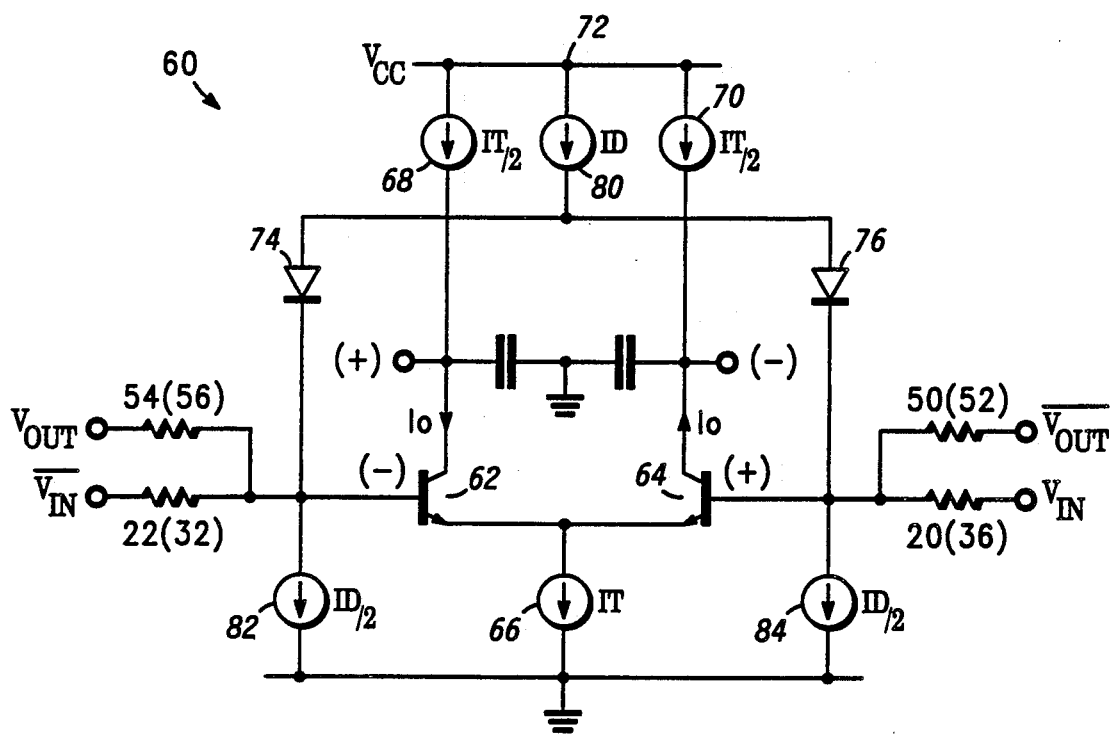
FIG. 2 is a schematic diagram illustrating a filter cell of the filter of FIG. 1.

Turning to FIG. 2, each filter cell of filter 10 is shown as including a wide band transconductance amplifier 60 comprised of differentially connected transistors 62 and 64 the emitters of which are coupled to current source 66 which sinks a tail current $I_T$. The base electrodes of the two transistors are coupled to the inverting and non-inverting inputs of the amplifier while the collectors are returned to Vcc at 72 via current sources 68 and 70, each of which source a current equal to one-half $I_T$. Current supply 80 which sources a current $I_D$ is coupled between conductor 72 and the anodes of a pair of diodes 74 and 76, the cathodes of which are returned respectively to the base of transistor 62 and the base of transistor 64. Each diode 74 and 76 is coupled to a respective current supply 82 and 84 both of which sink a current that is one-half the current sourced by current supply 80, i.e., $I_D/2$. Multiple inputs to each amplifier 60 of the individual filter cells is provide through the associated input resistors 20, 22 or 32, 36 and associated feedback resistors 50, 54 or 52, 56.

Recalling that prior art filters using cascaded single ended transconductance amplifiers, the damping factor $\zeta$ can be shown to be a function of:

$$\zeta \alpha \sqrt{\frac{C1 gm2}{C2 gm1}} \tag{1}$$

and that the natural resonant frequency is:

$$\omega_n = \sqrt{\frac{gm1 gm2}{C1 C2}} \tag{2}$$

Thus, the filter function can be varied controlling the damping factor, by adjusting either the ratios of the integrating capacitors C1, C2 or the ratios of the transconductance gm1, gm2. However, to get a damping factor greater than 1, the capacitor ratios required may not be suitable for manufacturing the filter in integrated circuit form. Furthermore, it is seen from equations 1 and 2 that the damping factor is not independent of the natural resonant frequency of the filter. Hence, if the damping factor is varied to control the filter response, the resonant frequency of the filter is also affected.

Referring back to FIGS. 1 and 2 and for simplification looking at feedback from the output of transconductance amplifier 14 to the input thereof the following equations can be derived. In general, the transconductance, gm, of the transconductance amplifiers is equal to:

$$gm = \frac{i_o}{Vin - Vo} \tag{3}$$

where: $i_o$ is the collector current of the amplifier, Vin and Vo are the input and output voltages of the amplifier.

Rearranging equation 3 and writing the equation in the s frequency domain, the transconductances of amplifiers 12 and 14 can be shown to be equal to:

$$V_{01} = i_{01}\left(\frac{1}{sC1}\right) = gm1(Vin - V_{02})\left(\frac{1}{sC1}\right) \tag{4}$$

and $$V_{02} = i_{02}\left(\frac{1}{sC2}\right) = gm2(V_{01} - K2V_{02})\left(\frac{1}{sC2}\right) \tag{5}$$

where $V_{01}$ and $V_{02}$ are the output voltages appearing at the outputs of amplifiers 12 and respectively and $i_{01}$ and $i_{02}$ are the outputs currents, C1 and C2 are the equivalent integrating capacitors on the outputs of the two amplifiers, and K2 is the feedback factor.

Substituting equation 4 into equation 5 and rearranging yields:

$$V_{02} = (Vin)\left(\frac{s^2 C1C2}{gm1 gm2} + \frac{s K2 C1}{gm1} + 1\right) \tag{6}$$

Hence, from equation 6, the natural resonant frequency and damping factor of filter 10 of the present invention are:

$$\omega_n = \sqrt{\frac{gm1 gm2}{C1 C2}} \tag{7}$$

and $$\zeta = \frac{K2}{2}\sqrt{\frac{gm2 C1}{gm1 C2}} \tag{8}$$

Thus, for filter 10 of the present invention it is seen that the damping factor is controllable by the factor K2 and is independent of the natural resonant frequency of the filter. Therefore, the filter transfer function can be varied independent of the gm's of the individual filter cells and the ratios of the integrating capacitors. This is a great improvement over prior filter designs using single ended transconductance amplifiers.

Referring now to FIG. 3 there is shown the simplified equivalent circuit of the input of filter cell 60 wherein Rin are the input resistors to the inverting and non-inverting inputs of the transconductance amplifier and Rfb are the feedback resistors thereto and rd is equivalent resistance of diodes 74 and 76. The diode resistances are shown coupled from the inverting and non-inverting inputs and ground. This assumes that a virtual ground at the interconnection of the equivalent resistances of the diode due to the symmetry of the differential amplifier.

From FIG. 3:

$$i_1 = \frac{Vd}{rd} = \frac{V_{01} - Vd}{Rin} + \frac{\overline{V_{02}} - Vd}{Rfb} \tag{9}$$

and $$i_2 = \frac{V_d}{r_d} = \frac{\overline{V_{01}} - V_d}{R_{in}} + \frac{V_{02} - V_d}{R_{fb}} \quad (10)$$

Assuming that Rin and Rfb >>> rd, and solving equations 9 and 10 for $i_1$ and $i_2$ gives:

$$i_1 = \frac{V_{01}}{R_{in}} + \frac{\overline{V_{02}}}{R_{fb}} \quad (11)$$

and $$i_2 = \frac{\overline{V_{01}}}{R_{in}} + \frac{V_{02}}{R_{fb}} \quad (12)$$

The actual current gain of the transconductance amplifier can be defined as the average of the diode currents times the gain factor $$\frac{I_T}{I_D}$$

or:

$$i_0 = \frac{i_1 + (-i_2)}{2}\left(\frac{I_T}{I_D}\right) \quad (13)$$

Hence:

$$i_0 = \left[\frac{V_{01}}{R_{in}} - \frac{V_{02}}{R_{fb}}\right]\left(\frac{I_T}{I_D}\right) \quad (14)$$

As $i_0$ equals the output current from the amplifier, $i_0$ and $i_{02}$ can be equated which gives:

$$gm2(V_{01} - K2V_{02}) = \left[\frac{V_{01}}{R_{in}} - \frac{V_{02}}{R_{fb}}\right]\left(\frac{I_T}{I_D}\right) \quad (15)$$

or $$gm2\, V_{01} = \frac{V_{01}}{R_{in}}\left(\frac{I_T}{I_D}\right) \quad (16)$$

and $$K2gm2V_{02} = \frac{V_{02}}{R_{fb}}\left(\frac{I_T}{I_D}\right) \quad (17)$$

from equations 16 and 17 it follows that:

$$K2 = \frac{R_{in}}{R_{fb}}. \quad (18)$$

Hence the damping factor, which controls the filter transfer function of filter 10, can be controlled by adjusting the resistor ratios of the input resistors and the feedback resistors.

Turning to FIG. 4 there is shown filter cell 60 of FIG. 2 in somewhat greater detail including the method and structure for providing common mode compensation of the filter cell in accordance with the present invention.

It is understood that like components in FIGS. 2 and 4 are designated by the same reference numbers. Moreover, for sake of clarity, diodes 74 and 76 and related current supplies have been omitted as not being germane to the present invention although required for operation of filter 10. Current supplies 68 and 70 (FIG. 2) are realized by a pair of PNP transistors 86 and 88 which have their base electrodes coupled to a source of bias potential $V_B$ and their emitter-collector conduction paths coupled between Vcc and the respective collectors of transistors 62 and 64. Similarly, current supply 66 is shown as comprising NPN transistor 92 having its collector-emitter conduction path coupled between the differentially connected emitters of transistors 62 and 64 and one end of resistor 94 the other end of which is coupled to ground reference. The base electrode of transistor 92 is coupled to node 102. The complementary outputs of amplifier 60 are coupled respectively through buffer amplifiers comprising transistors 96 and 106 to outputs 98 and 108 at which the output voltages Vout and $\overline{Vout0}$ are produced. The collectors of transistors 96 and 106 are coupled to Vcc while their emitters are respectively coupled to node 102 through resistors 100 and 110. Node 102 is applied to current supply 104 the latter of which sinks a current $I_{OS}$.

One aspect of the present invention is to set the common mode voltage at outputs 98 and 108 to a predetermined known average values and to maintain this common mode average during operation of the differential amplifier of the filter cell. If resistors 100 and 110 are matched node 102 is essentially at a virtual ground for differential mode signals. One-half of the current of current supply 104 flows through each of the two resistors. Hence, the common mode average voltage appearing at outputs 98 and 108 is equal to:

$$V_{R94} + V_{BE92} + \frac{I_{104}}{2}(R) \quad (19)$$

where $V_{R94}$ is the voltage across resistor 94, $V_{BE92}$ is the base-emitter voltage of transistor 92 and R is either resistor 100 or 110.

By setting the common mode voltage at Vout and $\overline{Vout0}$ to known and equal values, transistors 62, 64, 86 and 88 are inhibited from saturating even in light of the high common mode gain of the differential amplifier. Now if the mean output voltage should increase, for example, the common mode configuration will cause the voltage at summing node 102 to rise. This will cause transistor 92 to increase conduction thereby increasing $I_T$ and reducing the average common mode voltage at outputs 98 and 108.

Since the common mode loop is a closed loop and due to the high gain thereof, integrating capacitors 38 and 39 present a significant phase shift therethrough to create a potential instability problem if the interconnection therebetween is connected to ground as previously shown. However, by taking the junction of the two capacitors, which are at a differential virtual ground, and feeding it back to the base of transistor 92 the capacitors provide the dominant pole of the common mode loop. Hence, the capacitance of the common mode parallel capacitors is multiplied through transistor 92 to present a large capacitance value as seen at the base of transistor 92 in the common mode loop which therefore improves the frequency stability of the filter cell.

Hence, what has been described above is improved filter cell for an integrating filter in which the integrating capacitors of the filter cell are configured to provide the time constant for the filter incorporating the filter cell in the differential mode of operation and which compensate the common mode loop of the filter cell to inhibit loop instability.

What is claimed is:

1. An integrated integrating filter including at least a pair of cascaded differential transconductance amplifiers coupled between first and second inputs of the filter and first and second outputs of the filter, and integrating circuit means coupled across the differential outputs of each of the pair of amplifiers, the improvement comprising:

each of the pair of differential transconductance amplifiers including:
   a. first and second transistors each having a base, an emitter and a collector, said bases being coupled respectively to first and second inputs of the amplifier, said emitters being interconnected;
   b. first current supply means for providing first and second predetermined currents to said collectors of said first and second transistors;
   c. first and second buffer circuit means for respectively coupling said collectors of said first and second transistors to the first and second outputs of the amplifier;
   d. first and second resistors coupled between an amplifier circuit node and said first and second outputs of the amplifier respectively;
   e. a third transistor having a base, an emitter and a collector, said base being coupled to said amplifier circuit node, said collector being coupled to said interconnected emitters, and said emitter being coupled to a first power supply conductor; and
   f. second current supply means coupled between said amplifier circuit node and said first power supply conductor for sinking a predetermined current; and the integrating circuit means including first and second capacitors series coupled between said collectors of said first and second transistors with the interconnection therebetween being coupled to said base of said third transistor.

2. The filter of claim 1 wherein said first buffer circuit means includes a fourth transistor having a base, an emitter and a collector, said base being coupled to said collector of said first transistor, said emitter being coupled to said first output of the amplifier and said collector being coupled to a second power supply conductor.

3. The filter of claim 2 wherein said second buffer circuit means includes a fifth transistor having a base, an emitter and a collector, said base being coupled to said collector of said second transistor, said emitter being coupled to said second output of the amplifier and said collector being coupled to said second power supply conductor.

4. The filter of claim 3 wherein said first current supply means includes sixth and seventh transistors each having a base, an emitter and a collector, said emitters being coupled to said second power supply conductor, said bases being coupled to a terminal at which a bias potential is applied, said collector of said sixth transistor being coupled to said collector of said first transistor and said collector of said seventh transistor being coupled to said collector of said second transistor.

5. The filter of claim 4 including third and fourth resistors coupled respectively between said first and second inputs of the filter and said first and second inputs of the first one of the pair of amplifiers and sixth and seventh resistors coupled respectively between said first and second outputs of said first one of said pair of amplifiers and said first and second inputs of the second one of the pair of amplifiers.

6. A filter cell having common mode compensation for use in a differential differentiating filter, comprising:

a transconductance amplifier that includes:
   a. first and second transistors each having a base, and emitter and a collector, said bases being coupled respectively to first and second inputs of the filter cell and said emitters being interconnected;
   b. first current supply means coupled to said collectors of said first and second transistors for providing current thereto;
   c. a third transistor having a base, an emitter and a collector, said collector being coupled to said interconnected emitters, said emitter being coupled to a power supply conductor;
   d. first circuit means for coupling said collector of said first transistor to a first output of the amplifier;
   e. second circuit means for coupling said collector of said second transistor to a second output of the amplifier;
   f. first and second resistors coupled between a circuit node and said first and second outputs of the amplifier respectively;
   g. second current supply means coupled between said circuit node and said power supply conductor; and
   h. means for coupling said base of said third transistor to said circuit node;

first and second capacitors series coupled between said collectors of said first and second transistors; and means for coupling the base of said third transistor to the interconnection between said first and second capacitors.

7. The filter cell of claim 6 including a third resistor coupled between said emitter of said third transistor and said power supply conductor.

* * * * *